(12) United States Patent
Bériault

(10) Patent No.: US 6,456,472 B1
(45) Date of Patent: *Sep. 24, 2002

(54) ESD PROTECTION IN MIXED SIGNAL ICS

(75) Inventor: Richard Bériault, Hull (CA)

(73) Assignee: Philsar Semiconductor Inc., Nepean (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/545,887

(22) Filed: Apr. 7, 2000

(51) Int. Cl.$^7$ .................................................. H02H 9/00

(52) U.S. Cl. ........................................................ 361/56

(58) Field of Search .............................. 361/54, 56, 58, 361/90, 91.1, 91.5, 111, 117–119; 327/310, 313, 318, 327, 328; 257/173, 355, 360

(56) References Cited

U.S. PATENT DOCUMENTS

| | | | | |
|---|---|---|---|---|
| 5,515,225 A | * | 5/1996 | Gens et al. | 361/56 |
| 5,991,135 A | * | 11/1999 | Saleh | 361/56 |
| 6,078,068 A | * | 6/2000 | Tamura | 257/355 |
| 6,104,588 A | * | 8/2000 | Hariton et al. | 361/111 |

* cited by examiner

*Primary Examiner*—Ronald W. Leja
(74) *Attorney, Agent, or Firm*—Harold C. Baker; Robert A. Wilkes; Robert G. Hendry

(57) ABSTRACT

The invention provides ESD protection for IC's while isolating the different power supplies from one another. A network in the IC has a plurality of circuit cells through which the IC receives power. Each circuit cell provides localized electrostatic discharge protection. With each circuit cell coupled to a global node through a dual current direction coupling network and with portions of the global node physically separating the circuit cells, any noise, interference, or stray ESD current generated by a circuit cell is shunted away from other circuit cells to the global node. An off-chip ground connection coupled to the global node provides a destination for this noise or interference.

5 Claims, 3 Drawing Sheets

ESD PROTECTION IN MIXED SIGNAL ICS

FIELD OF THE INVENTION

The invention relates to circuits for electrostatic discharge (ESD) protection and more particularly to such circuits which provide better isolation between power supplies.

BACKGROUND TO THE INVENTION

Electrostatic discharge (ESD) is a problem for most integrated circuits (ICs). If not properly diffused, ESD can damage, destroy, or render unreliable an IC. Protection circuits must therefore be incorporated into ICs so that ESD current can be safely diffused. ESD current can be in the order of amperes with a duration lasting anywhere from 1 ns to 100 ns. These ESD protection circuits must therefore be able to handle such large currents.

In order to provide ESD protection, there must be a low impedance electrical circuit between any two pins on the IC. This circuit must be able to tolerate the range of ESD current values, usually in the order of 1 AMP, while simultaneously not developing a voltage too large for the device. As an example, in a 0.5 $\mu$m CMOS process, the maximum voltage across any one transistor may be 3.6 volts.

In mixed signal ICs, ICs which handle both analog and digital signals, another main concern is interference between these two types of signals. This problem has been partially solved by separating the power supplies for the analog and digital portions of the IC.

Previously, one solution to theses two problems was the use of a single clamping circuit connected to the different power supply pads. Worley et al. in U.S. Pat. No. 5,654,862 uses a single clamp connected to a bus which is in turn connected to the separate power supply pads. Unfortunately, this solution has run into problems in applications where isolation between supplies is critical. Capacitance effects due to the coupling diodes do not provide sufficient isolation between power supplies. Interference between analog and digital signals therefore occur, rendering this solution ineffective for applications where isolation is critical.

Referring to FIG. 1, a schematic diagram of a prior art ESD protection circuit is illustrated. A first pair of diodes 10, 20 are serially coupled at junction 30. At a first end 40 of the pair of diodes 10, 20, a $V_{DD}$ power supply pad 50 is connected. At the second end 60 of the pair of diodes 10, 20, a $V_{ss}$ local ground 70 is connected. An input/output (I/O) pad 80 is coupled to the pair of diodes 10, 20 at junction 30. Coupled in parallel across the pair of diodes 10, 20, is a clamp circuit, in this case a Zener diode 90.

The pair of diodes 10, 20, allow current to flow in the direction indicated by arrow A. When the voltage between ends 40, 60 reach a certain value, the Zener diode 90's breakdown voltage, current flows through the Zener diode 90 in the direction of arrow B. This provides a path between any two of the pads 50, 80 70, thereby allowing any ESD current to be dissipated through the local ground 70. Also, the Zener diode 90, in breakdown mode, clamps the voltage between ends 40, 60 to a specific value, thereby preventing possible over voltage conditions.

However, the circuit of FIG. 1 still does not provide enough isolation between power supplies in mixed signal ICs.

What is therefore needed is a circuit which provides maximum isolation between the analog and the digital signals while providing ESD protection.

SUMMARY OF THE INVENTION

The invention provides ESD protection for IC's while isolating the different power supplies from one another. A network in the IC has a plurality of circuit cells through which the IC receives power. Each circuit cell also provides localized electrostatic discharge protection. With each circuit cell coupled to a global node through a dual current direction coupling network and with portions of the global node physically separating the circuit cells, any noise, interference, or stray ESD current generated by a circuit cell is shunted away from other circuit cells to the global node. An off-chip ground connection coupled to the global node provides a destination for this noise or interference.

In a first embodiment, the invention provides a network for electrostatic discharge protection in an integrated circuit, the network comprising:
 a global node coupled to an off-chip ground connection;
 a plurality of circuit cells, each cell comprising:
  a first pair of serially coupled diodes, said first pair allowing current to flow in a first direction;
  a positive power supply pad coupled to a first end of the first pair of diodes;
  a negative power supply pad coupled to a second end of the first pair of diodes;
  an I/O pad coupled to a junction point between the first pair of diodes;
  a circuit clamp connected in parallel with said first pair of diodes, said clamp being connected between the first end of the first pair of diodes and the second end of the first pair of diodes, said clamp providing a path for current to flow in a second direction;
  a coupling network coupled between an end of the first pair of diodes and the global node
 wherein
  the first direction is opposite the second direction, and
  the coupling network allows current to flow in two opposing directions.

In a second embodiment, the invention provides a network for electrostatic discharge protection in an integrated circuit, the network comprising:
 a global node;
 a plurality of circuit cells, each circuit cell having a plurality of power supply pads and each circuit cell providing local electrostatic discharge protection within the cell;
 a plurality of coupling networks, each coupling network coupling a circuit cell to the global node; wherein
 the coupling network allows current to flow in two opposing directions.

BRIEF DESCRIPTION OF THE DRAWINGS

A better understanding of the invention will be obtained by considering the detailed description below, with reference to the following drawings in which.

DESCRIPTION OF THE PREFERRED EMBODIMENT

Figure 1:
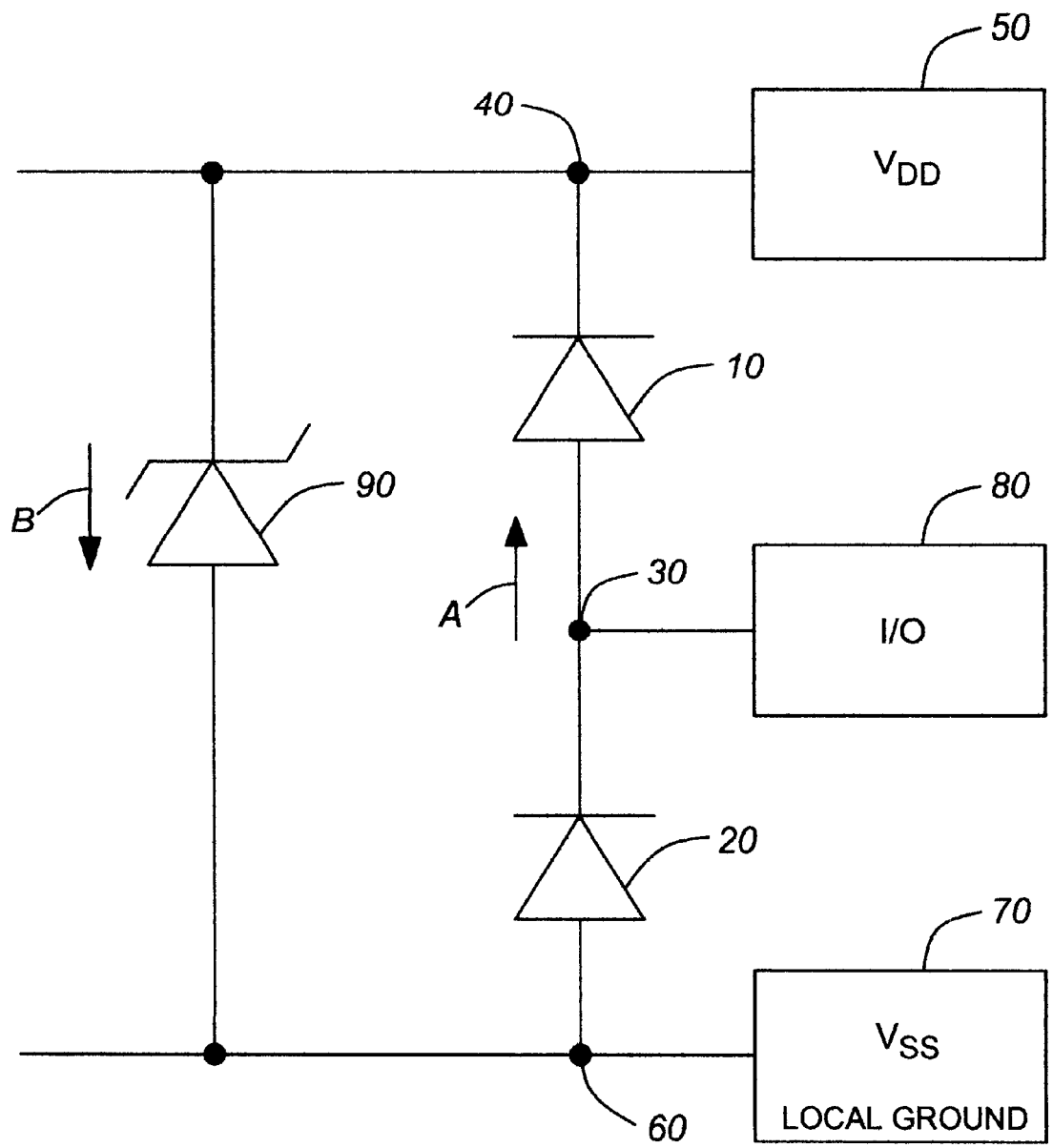
FIG. 1 is a schematic diagram of a prior art circuit used for ESD protection.

While the circuit of FIG. 1 dissipates any ESD current internally, as the ESD current has robust discharge paths between any two of the pads and does not need to be shunted outside of the circuit, isolation between power supplies is still inadequate.

If FIG. 1 is taken as a single circuit cell, an IC with multiple power supplies, such as a mixed signal IC handling different digital and analog signals, can have multiple circuit cells.

Figure 2:
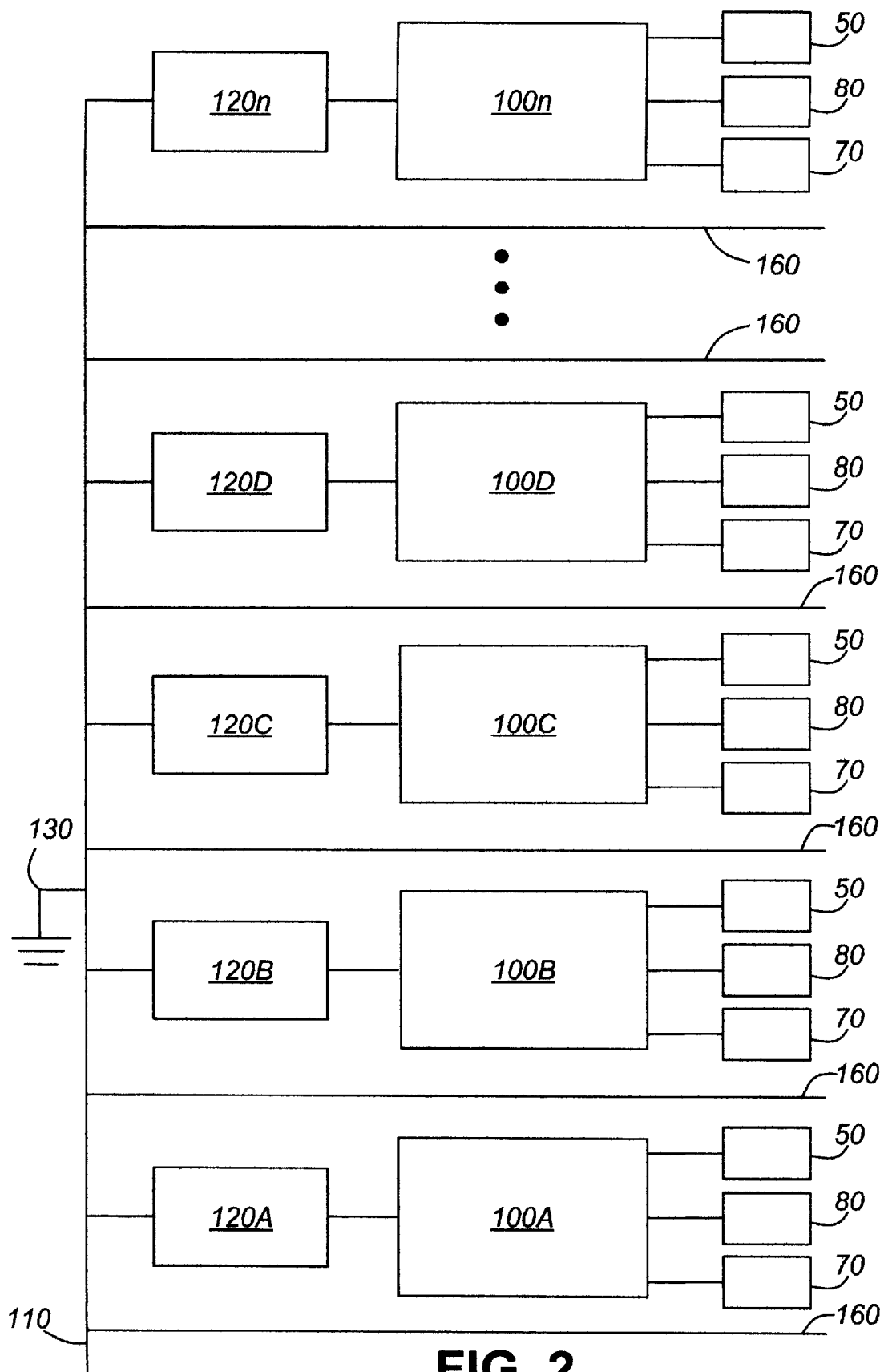
FIG. 2 is a schematic diagram of a first embodiment of the invention.

FIG. 2 illustrates a first embodiment of the invention using this configuration where each circuit cell provides local ESD protection.

Referring to FIG. 2, each circuit cell 100A, 100B, 10C ... 100N, is connected to a global node 110 through a coupling network 120A, 120B ... 120N. Each of the coupling networks 120A ... 120N allows current to flow into and out of the circuit cells 100A ... 100N. Any ESD current from any of the circuit cells 100A ... 100N is absorbed and dissipated within the cell which generates it. An off-chip ground 130 coupled to the global node absorbs any noise or interference generated by any of the circuit cells 100A ... 100N. The off-chip ground 130 may be connected to the global node 110 through either a bondwire and a pin or through a bondwire and an exposed pad. In the latter configuration, a 28 pin grid array package would thus have an extra 29th pin connected to the global node, with the 29th pin to be connected to a ground external to the chip.

This arrangement further reduces the interference between any of the power supplies, each of which is connected to a circuit cell.

Figure 3:
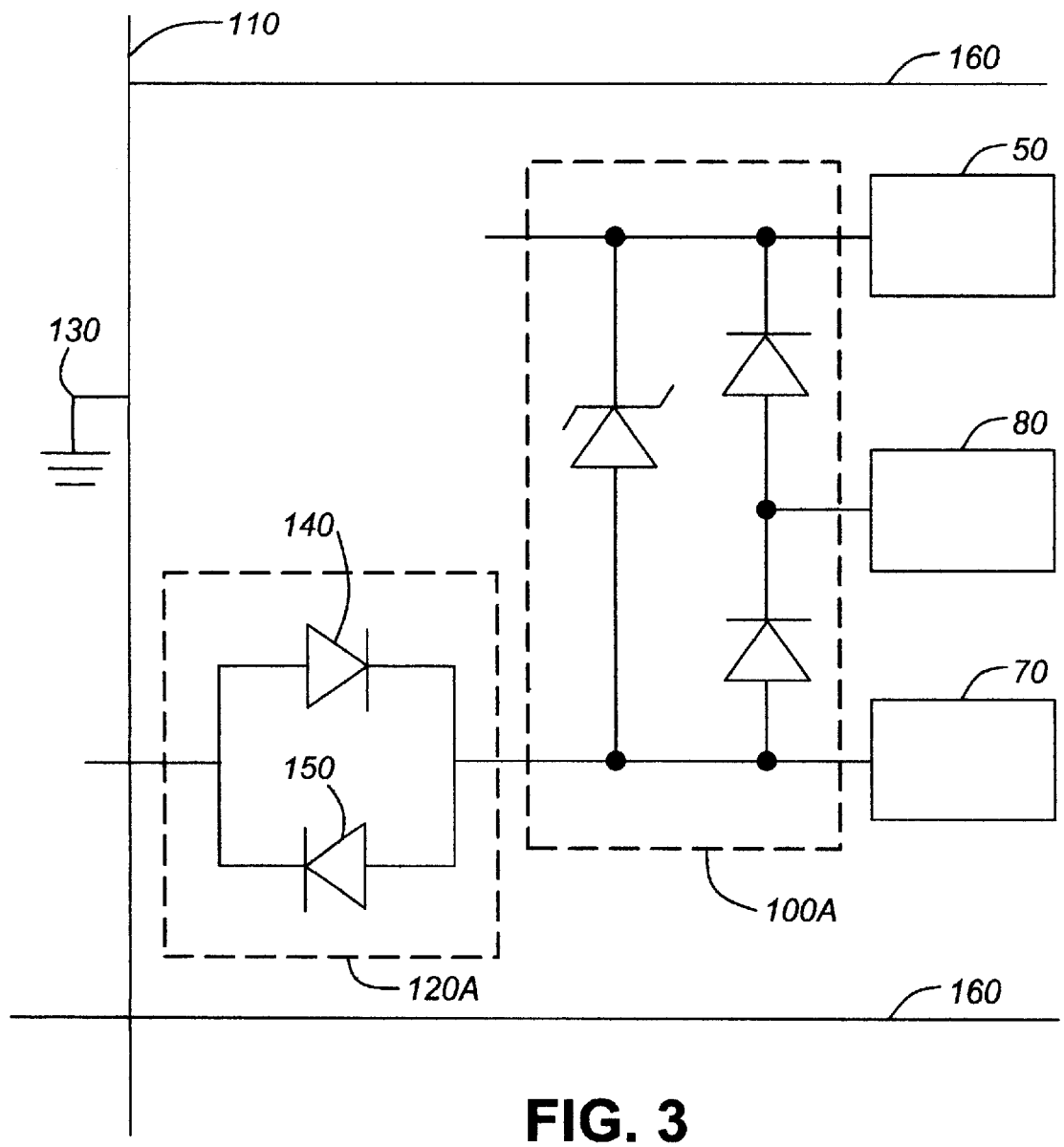
FIG. 3 is a detailed schematic of a portion of FIG. 2.

Regarding the coupling network 120A ... 120N, a preferred embodiment is illustrated in FIG. 3 along with a more detailed diagram of a circuit cell 10A. Referring to FIG. 3, the coupling network 120A is composed of a second pair of diodes 140, 150. This second pair of diodes 140, 150 is coupled in parallel to one another and are coupled such that one diode 140 allows current to flow in one direction while the other diode 150 allows current to flow in the opposite direction. Thus, the diodes are arranged to have opposing polarities. This arrangement allows ESD current to pass between circuit cells without producing over voltage conditions. The pair of diodes 140, 150 allow currents of both polarities to pass from the circuit cell 100A to the global network node 110.

To prevent overvoltage conditions when ESD current passes between circuit cells, it is best to position the global ground network between each of the circuit cells. As can be seen from FIG. 2, these portions 160 of the global node physically separate circuit cells from neighboring circuit cells.

It should be noted that, in FIG. 3, the circuit cell 100A has the structure shown in FIG. 1 and described above. However, other circuit cells which provide local ESD protection can be used instead of circuit cell 100A.

It should also be noted that, while it is preferable for the global node to be coupled to a ground connection, this is not necessary. The global node can be left floating within the IC.

A person understanding this invention may now conceive of alternative structures and embodiments or variations of the above all of which are intended to fall within the scope of the invention as defined in the claims that follow.

I claim:

1. A network for electrostatic discharge protection in a mixed signal integrated circuit, the network comprising:

a global node;

a plurality of circuit cells, each circuit cell having a $V_{DD}$ power supply pad, a $V_{SS}$ power supply pad, a pair of serially connected diodes poled to conduct current from said $V_{SS}$ to said $V_{DD}$ power supply pad, and an I/O pad connected to the junction of said serially connected diodes, and a Zener diode connected between the $V_{DD}$ and $V_{SS}$ pads, on breakdown to conduct current from the $V_{DD}$ to $V_{SS}$ pads, each circuit cell providing local electrostatic discharge protection within the cell;

a coupling network for each circuit cell, each coupling network coupling a circuit cell to the global node;

said coupling network comprising a pair of parallel connected oppositely poled diodes to allow current to flow in two opposing directions, the global node is coupled to an off-chip ground connection, and portions of the global node are physically positioned to separate each circuit cell from neighbouring circuit cells.

2. A network for electrostatic discharge protection in an integrated circuit, the network comprising:

a global node coupled to a ground connection;

a plurality of circuit cells, each cell comprising:

a first pair of serially coupled diodes, said first pair allowing current to flow in a first direction;

a positive power supply pad coupled to a first end of the first pair of diodes;

a negative power supply pad coupled to a second end of the first pair of diodes;

an I/O pad coupled to a junction point between the first pair of diodes;

a circuit clamp coupled in parallel to said first pair of diodes, said clamp being coupled between the first end of the first pair of diodes and the second end of the first pair of diodes, said clamp providing a path for current to flow in a second direction;

a coupling network coupled between an end of the first pair of diodes and the global node wherein the first direction is opposite the second direction, the coupling network allows current to flow in two opposing directions, and partitions of the global node are physically positioned to separate each circuit cell from neighbouring circuit cells.

3. A network as claimed in claim 2 wherein the coupling network is a second pair of diodes coupled in parallel and with opposing polarities to each other.

4. A network as claimed in claim 2 wherein the clamp is a Zener diode.

5. A network as claimed in claim 2 wherein the clamp provides a path for current to flow in the second direction when a voltage difference between the first end and the second end is higher than a specified voltage.

* * * * *